United States Patent
Gregorec, Jr. et al.

(10) Patent No.: US 6,731,102 B2
(45) Date of Patent: May 4, 2004

(54) ELECTRONIC TEST INSTRUMENT WITH EXTENDED FUNCTIONS

(75) Inventors: James L. Gregorec, Jr., Sycamore, IL (US); John B. Crosby, Gold Beach, OR (US); Rey P. Harju, Fullerton, CA (US)

(73) Assignee: Ideal Industries, Inc., Sycamore, IL (US)

( * ) Notice: Subject to any disclaimer, the term of this patent is extended or adjusted under 35 U.S.C. 154(b) by 0 days.

(21) Appl. No.: 09/774,526

(22) Filed: Jan. 31, 2001

(65) Prior Publication Data

US 2002/0101230 A1 Aug. 1, 2002

(51) Int. Cl.[7] .............................. G01R 17/06; G01R 7/00
(52) U.S. Cl. ..................................... 324/99 D; 324/142
(58) Field of Search ................................ 324/126–127, 324/115–117 R, 660, 99 D, 111–117 H, 142; 340/660; 388/800, 806; 318/254

(56) References Cited

U.S. PATENT DOCUMENTS

| | | | | |
|---|---|---|---|---|
| 3,840,808 A | * | 10/1974 | Liebermann | 324/127 |
| 4,206,413 A | * | 6/1980 | Cox et al. | 324/102 |
| 4,634,944 A | * | 1/1987 | Hastings et al. | 324/122 |
| 4,799,005 A | * | 1/1989 | Fernandes | 324/127 |
| 4,829,239 A | * | 5/1989 | Holstein et al. | 324/117 H |
| 5,349,289 A | * | 9/1994 | Shirai | 324/127 |
| 5,412,312 A | * | 5/1995 | Crass et al. | 318/443 |
| 5,422,570 A | * | 6/1995 | Moreira | 324/177 |
| 5,877,618 A | * | 3/1999 | Luebke et al. | 324/72.5 |
| 5,896,096 A | * | 4/1999 | Kim | 340/825 |
| 5,923,161 A | * | 7/1999 | Frankovitch, Jr. et al. | 324/115 |
| 6,043,640 A | * | 3/2000 | Lauby et al. | 324/127 |

* cited by examiner

*Primary Examiner*—Kamand Cuneo
*Assistant Examiner*—Jermele M. Hollington
(74) *Attorney, Agent, or Firm*—Cook, Alex, McFarron, Manzo, Cummings & Mehler, Ltd.

(57) ABSTRACT

An electronic test instrument in the form of a clamp meter has a non-contact voltage sensing circuit which includes a blade and sensor built into the clamp. The test instrument also has a shaker circuit that produces a tactile vibration in the presence of an AC voltage. The intensity of the vibration is proportional to the level of the AC voltage. A clean power indicator circuit is provided as well. The clean power circuit compares the level of harmonic distortion plus noise to the full signal and activates an LED if the distortion plus noise is within acceptable limits.

13 Claims, 8 Drawing Sheets

ELECTRONIC TEST INSTRUMENT WITH EXTENDED FUNCTIONS

BACKGROUND OF THE INVENTION

This invention relates generally to electronic test instruments and particularly to multimeters of the type used for measuring parameters such as AC voltage and current, DC voltage and current and resistance. Such instruments with a digital display are known as digital multimeters or DMM's. Some of these instruments are equipped with a clamp for surrounding a cable or bus for the purpose of measuring current without tapping into the cable. The present invention adds functions to an electronic test instrument beyond what has been provided in the past. A recurring safety issue for electricians is determining whether it is safe to work on a particular line or cable, i.e., whether the line is live or dead. The present invention provides the capability of making that determination quickly through either tactile or visual indicators.

SUMMARY OF THE INVENTION

An electronic test instrument is provided with a shaker motor that provides a tactile indication of the presence of a voltage. The shaker motor vibrates at a speed that is proportional to the voltage level, thereby providing a general sense to the user of the voltage level's magnitude. The instrument may further include a clean power circuit that detects the presence of excessive harmonic distortion and noise on an AC signal. Finally, the test instrument may have a clamp with a built-in non-contact voltage sensor.

BRIEF DESCRIPTION OF THE DRAWINGS

FIGS. 2a, 2b and 2c will be referred to collectively as FIG. 2.

FIGS. 3a, 3b and 3c will be referred to collectively as FIG. 3.

DETAILED DESCRIPTION OF THE INVENTION

Figure 1:
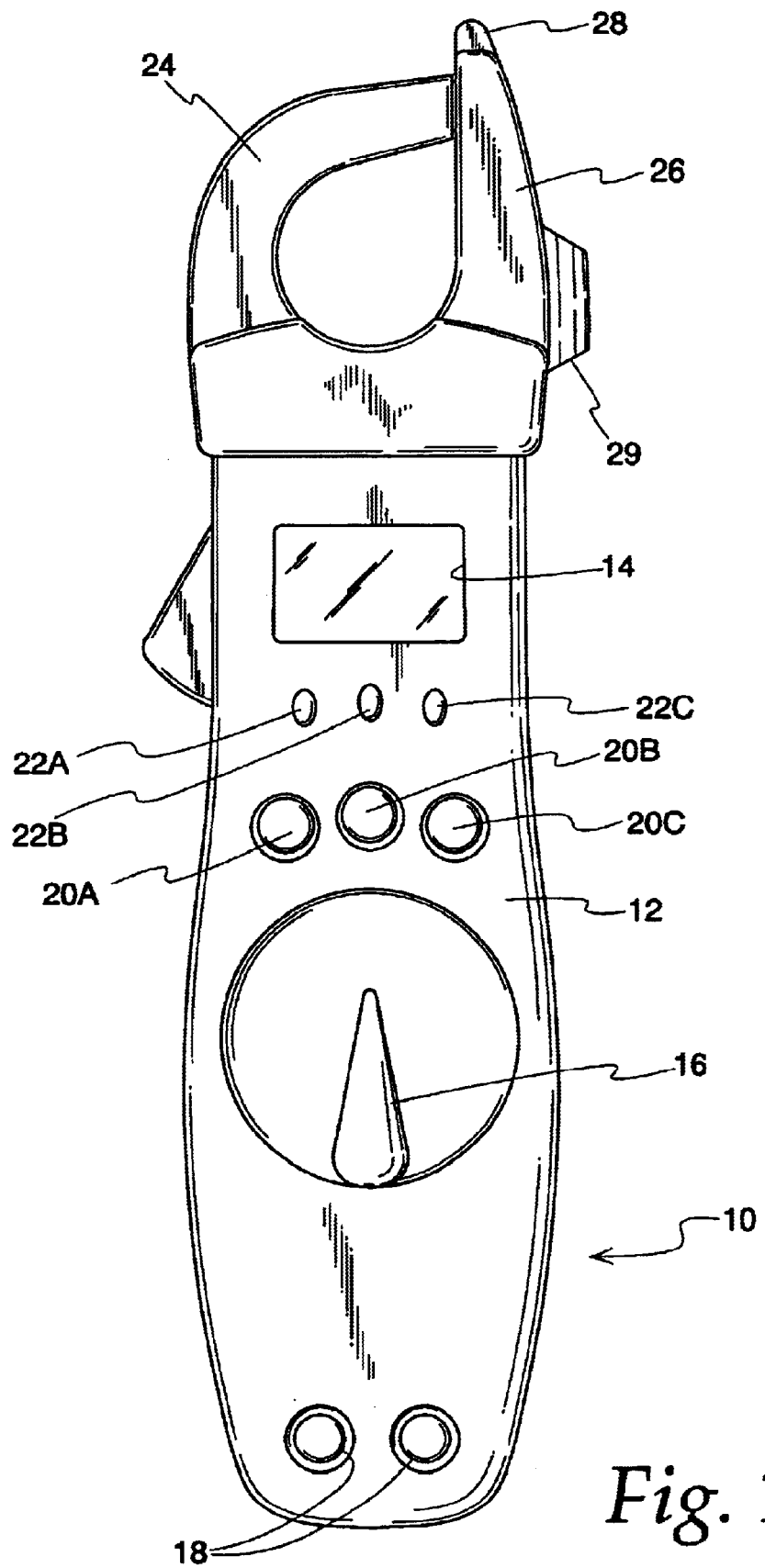
FIG. 1 is a front view of an electronic test instrument of the present invention.

FIG. 1 illustrates an electronic test instrument 10 incorporating the functions of the present invention. The meter has a housing 12 which contains a digital display 14, a selection knob 16 and a pair of input jacks 18 for receiving test leads (not shown). The test leads would include a common probe and an input probe. The housing also has a series of pushbuttons 20A,B,C associated with its testing functions. For example, one of the buttons may be used to activate the non-contact voltage function. Indicator lights 22A,B,C, which may be LED's or the like, are located in the housing to provide visual feedback to the user. A clamp at the top of the housing includes a movable jaw 24 that is spring-biased into engagement with a fixed jaw 26. A relatively flat blade 28 projects from the fixed jaw. The jaws and blade are molded from a suitable plastic material such as ABS. Inside the blade is a metal plate that serves as a sensor for the non-contact voltage function. A wire threaded through the interior of the fixed jaw 26 electrically connects the sensor to the non-contact voltage circuitry. That circuitry will be described below. Although not shown in the front view of FIG. 1, the back of the housing may have one or more slots or channels for mounting the test leads or probes, as is conventional. A clip 29 for mounting a test lead may be provided on the fixed jaw 26. It will be understood that the housing in its interior mounts the circuit boards necessary for performing the testing functions.

Figure 2A:
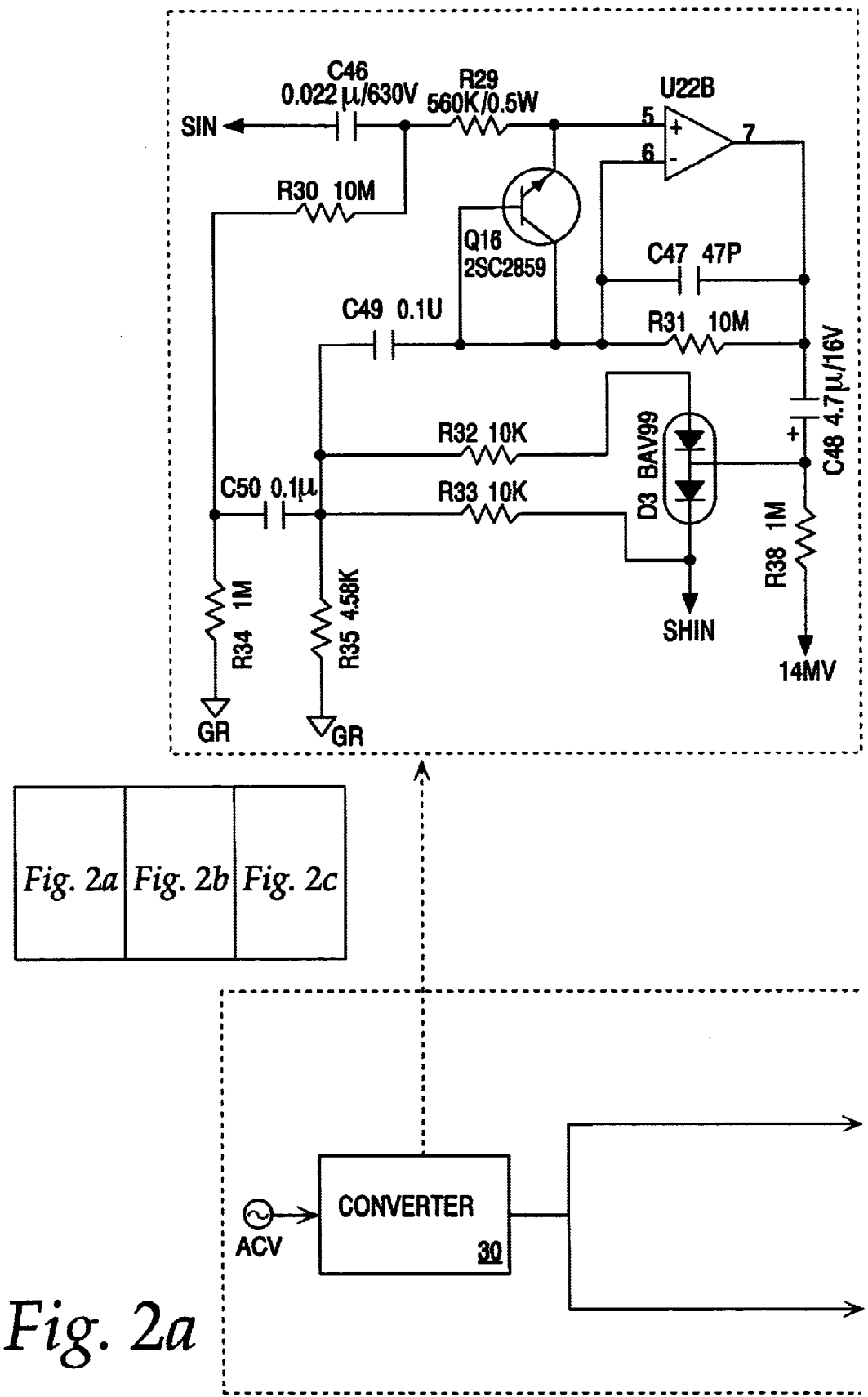
FIGS. 2a, 2b and 2c form a combined block diagram and circuit diagram of the shaker circuit. The Figures joined together as indicated in FIG. 2a form the complete circuit.
Figure 2B:
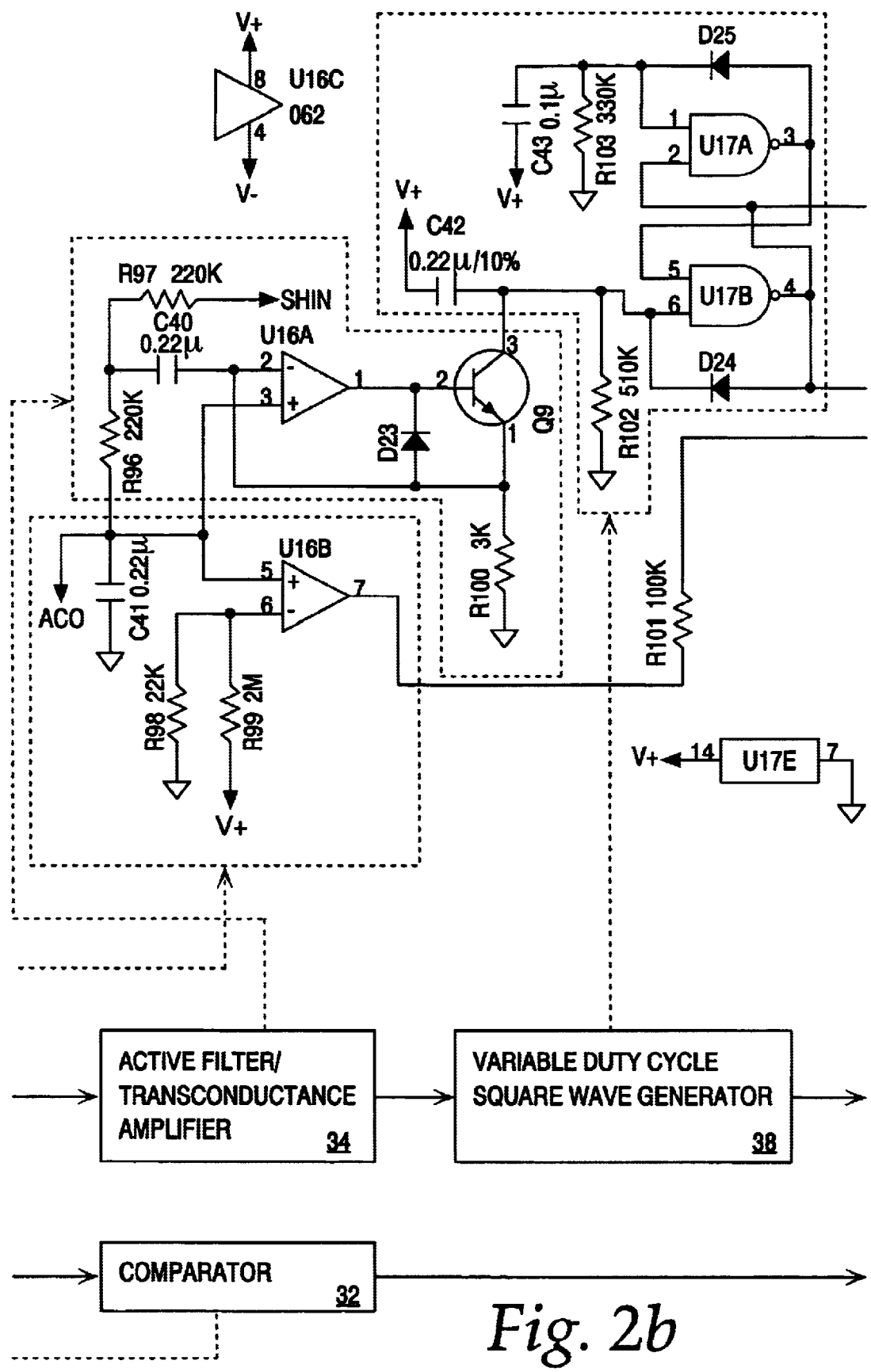
Figure 2C:
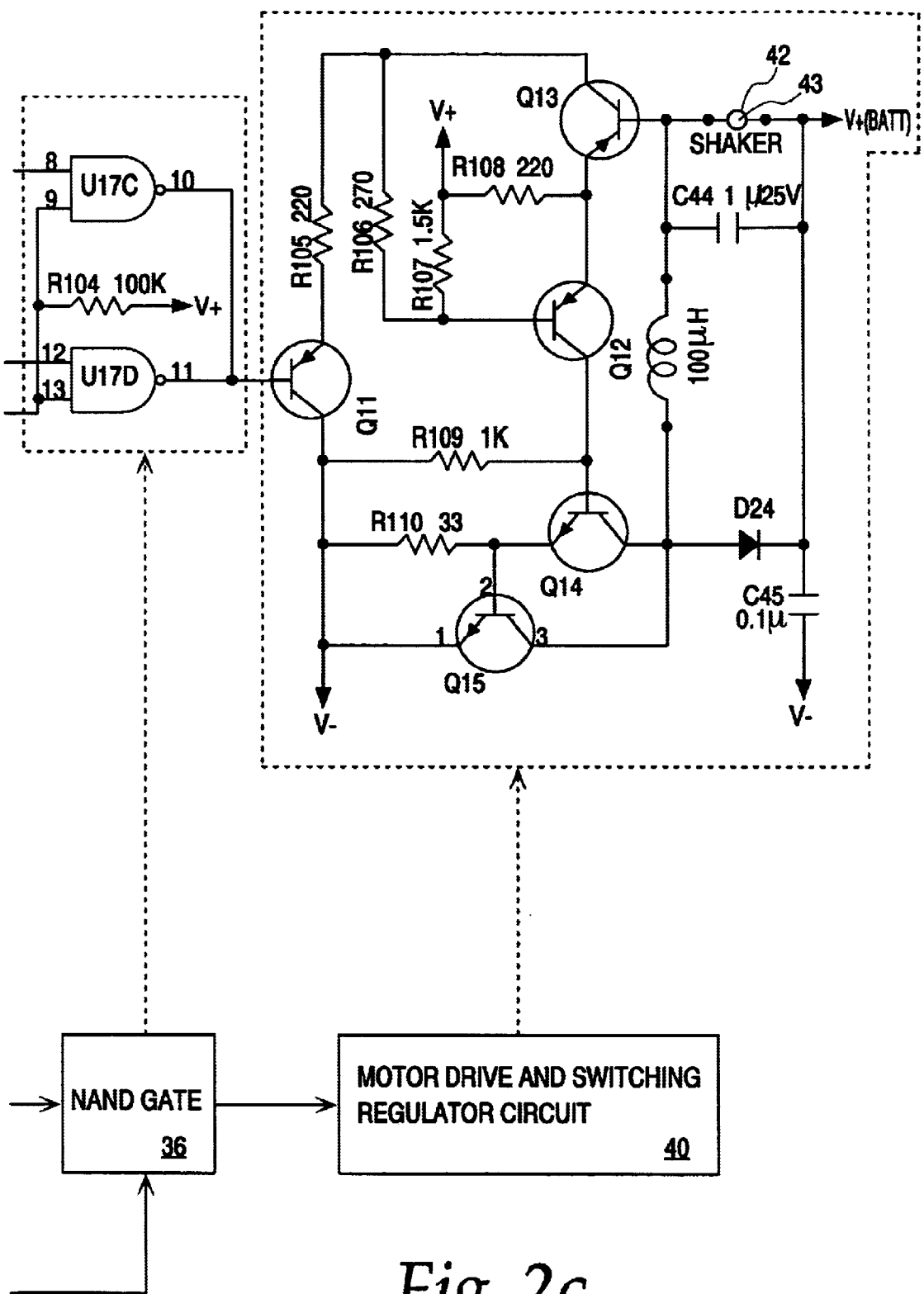
Figure 3A:
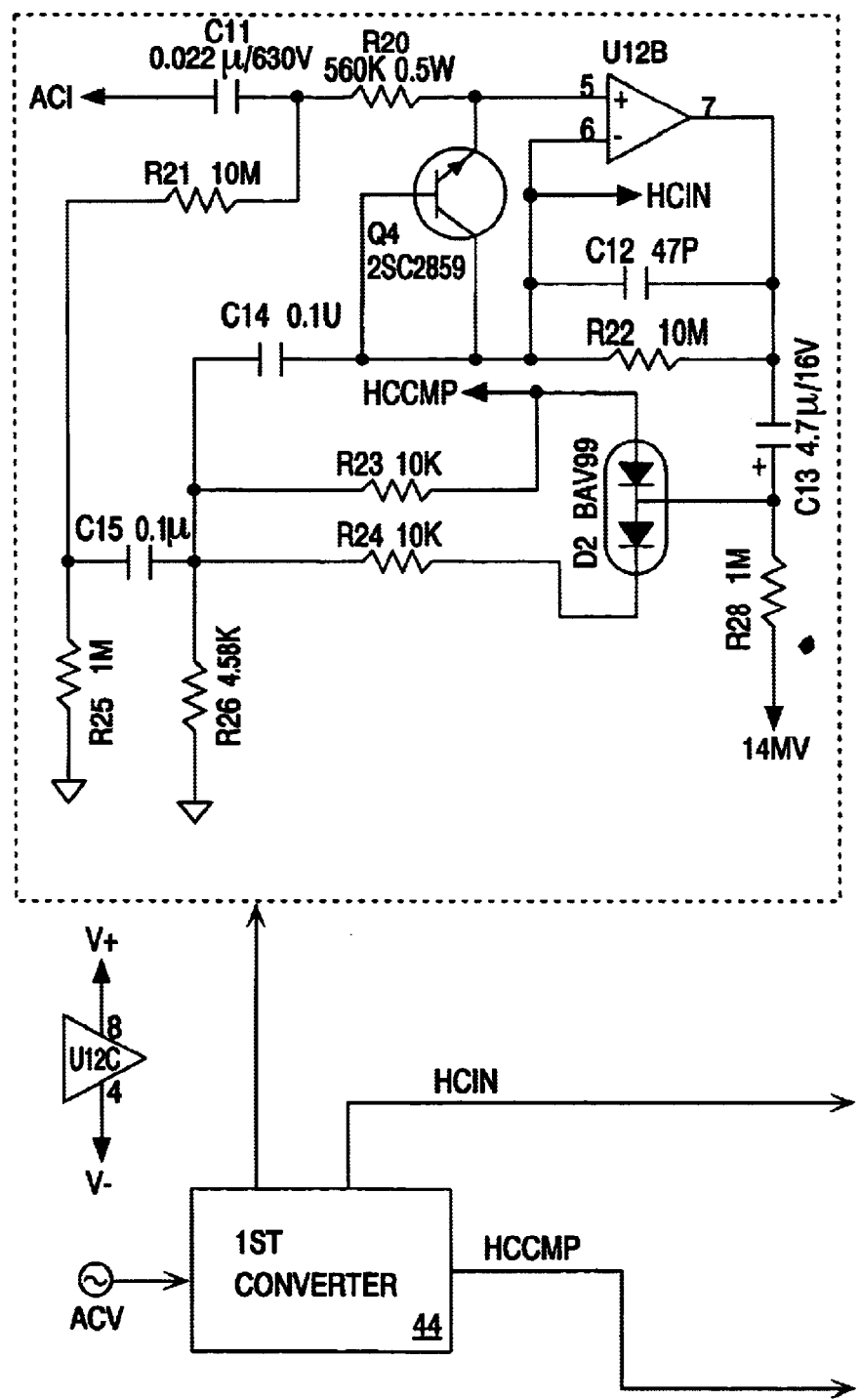
FIGS. 3a, 3b and 3c form a combined block diagram and circuit diagram of the clean power circuit. The Figures joined together as indicated in FIG. 3a form the complete circuit.
Figure 3B:
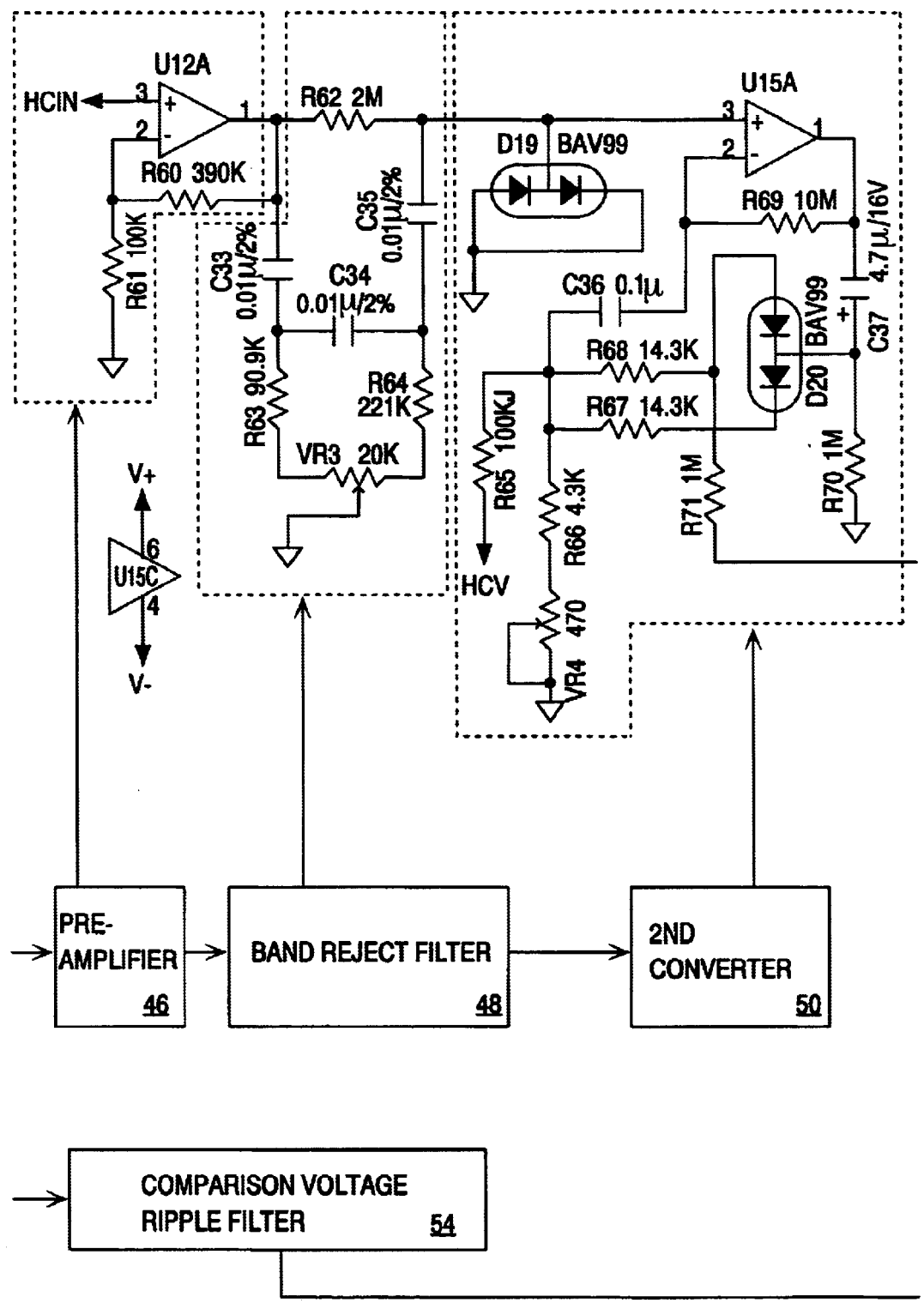
Figure 3C:
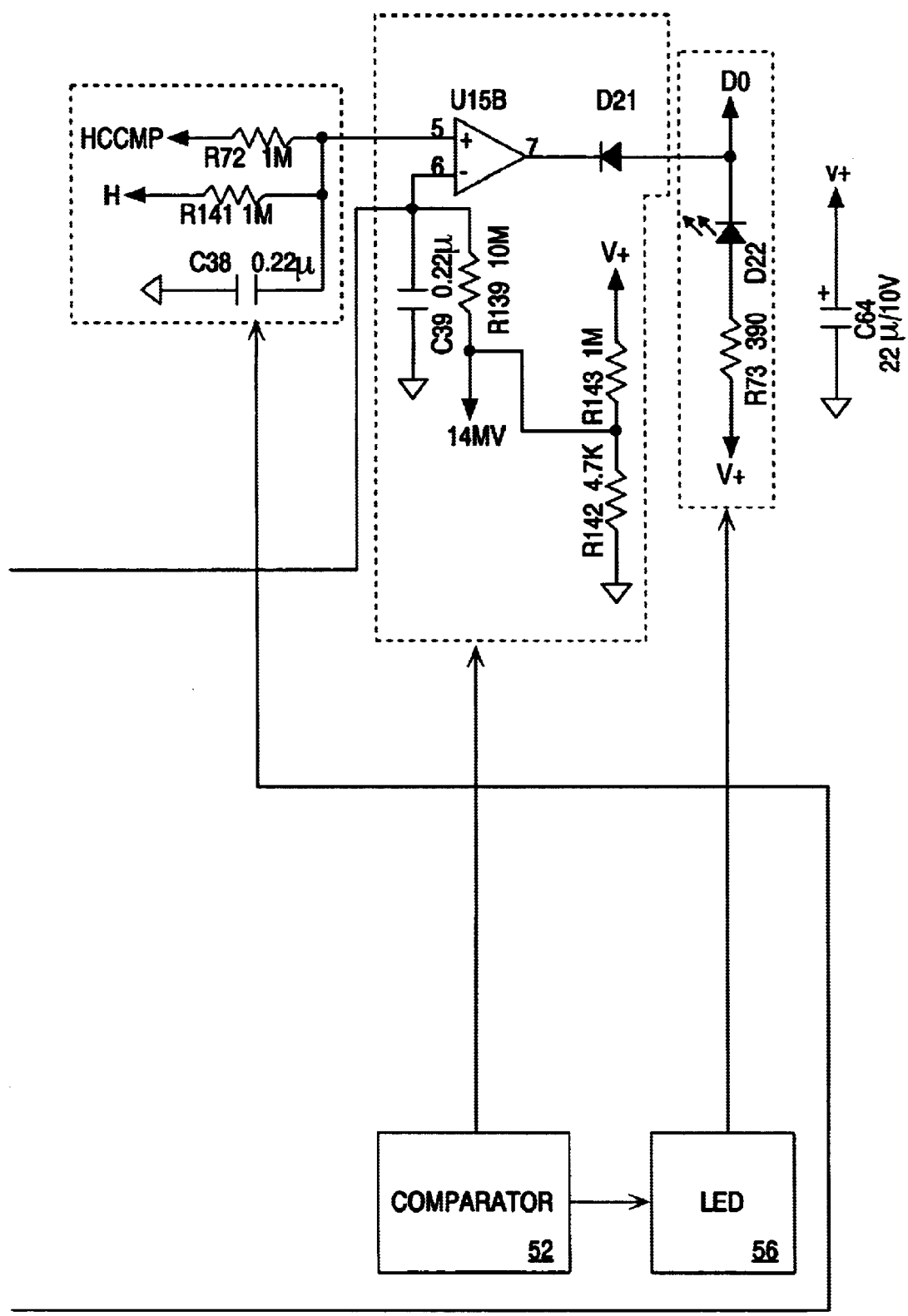
Figure 4:
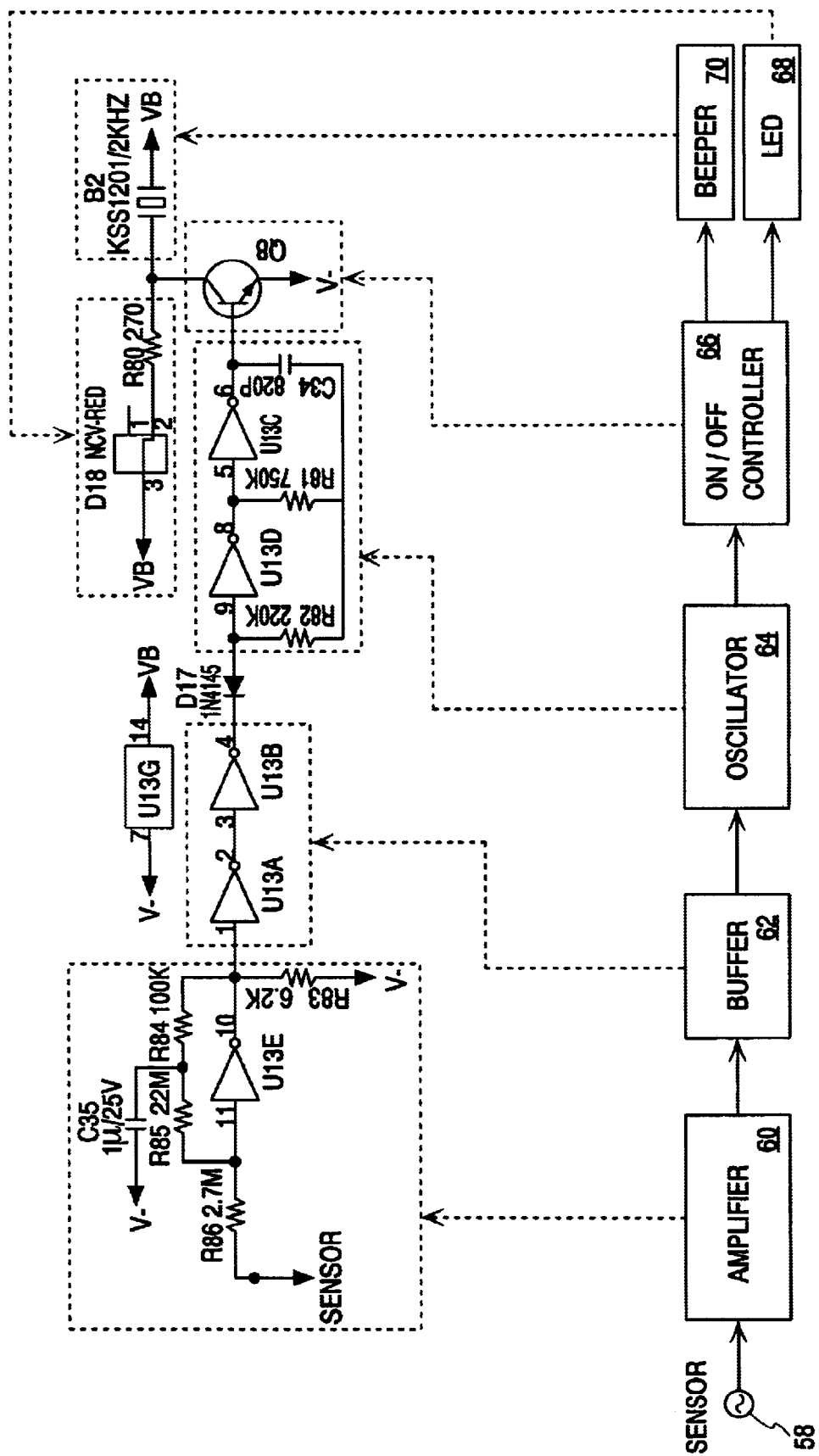
FIG. 4 is a combined block diagram and circuit diagram of the non-contact voltage circuit.

In addition to the standard AC and DC voltage and current measurements the present invention adds functions not previously found in hand-held clamp meters. The circuits for these functions will now be described. FIGS. 2–4 combine a block diagram and detailed circuit diagram for the respective circuits. The block diagram portions of the Figures provide a functional description of the circuit while the circuit diagram shows the detailed components that perform the indicated functions. The dotted lines from each block point to a dotted box which contains the portion of the circuit that corresponds to the function described in the block.

The shaker circuit in FIG. 2 produces a vibration that can be felt by a user to indicate the presence of an AC voltage. The speed of the vibration, and thus its intensity, is proportional to the level of the AC voltage. This voltage-dependent vibration intensity provides a general sense to the user of the voltage's magnitude. This function allows the user to quickly determine whether a wire or cable is safe to work on.

The shaker circuit has an AC voltage supplied through the instrument's test leads to a converter circuit 30. The converter circuit is typical of those commonly found in standard DMM's. Accordingly, this portion of the shaker circuit requires nothing beyond what is already in most DMM's. The converter circuit 30 is connected to the input probe either directly or via an input attenuator at SIN and ground. The converter circuit 30 converts the AC voltage input signal at SIN to an equivalent DC control level voltage at SHIN. The DC control level voltage SHIN is a positive-going analog equivalent DC signal on the order of 0–200 mV. The DC control level voltage is supplied to both a comparator 32 and an active filter/transconductance amplifier circuit 34. The DC control level voltage at SHIN is passed through two RC filters defined by R97, C40 and R96, C41. These components, together with op amp 16A, comprise the active filter. The purpose of the filter is to remove any residual AC ripple from SHIN.

The comparator 32 circuit includes op amp U16B which receives the filtered DC control level voltage on its pin 5. It is compared with a known reference voltage defined by R98 and R99 and supplied to op amp U16B at pin 6. In the circuit illustrated the reference voltage is about 20% of full scale, or about 40 mV. If the DC control level voltage is below the reference voltage, the comparator 32 signals a NAND gate 36 to prevent operation of the shaker motor. Gates U17C and U17D simply gate the whole circuit so the comparator 32 can stop everything if the input is too low. Two gates are used in parallel in circuit 36 to minimize the effect of the base current of transistor Q11. If the DC control level voltage is above the reference voltage, the comparator 32 signals NAND gate 36 to permit operation of the shaker motor. The purpose of the comparator 32 is to assure the shaker motor will not run at low voltage levels. If the motor were activated at low voltage levels it would needlessly drain the battery while not providing useful information. The comparator prevents that from happening.

The active filter/transconductance amplifier circuit 34 includes op amp U16A and transistor Q9. Q9's collector is a sinking current source causing the voltage on capacitor C42 to ramp downwardly at a rate dictated by the magnitude of the DC control level voltage SHIN, which of course in turn depends on the magnitude of the AC input voltage. The current in Q9 follows the AC input voltage. The emitter current in Q9 is SHIN divided by the value of resistor R100, in this case 3K ohms. The collector current in Q9 is essentially the same as the emitter current. Because Q9 is a constant current device, its current, if any, does not change even though the voltage on capacitor C42 changes. Capacitor C42 is part of a variable duty cycle square wave generator circuit 38. In addition to capacitor C42 and resistor R102, circuit 38 includes a free running multivibrator defined by NAND gates U17A and U17B and diodes D24 and D25. The multivibrator produces a square wave signal, the on time of which is governed by capacitor C43 and resistor R103. The off time is governed by C42 and the sum of the currents through resistor R102 and through Q9 and R100. R102 is there to keep the multivibrator running even if there if no input voltage at SIN. It can be seen that as the DC control level voltage SHIN increases, the current through Q9 increases, which decreases the time required to bring C42 to a level that changes the state of the multivibrator. Each time C42 reaches this threshold the multivibrator sends an "on" pulse of fixed width to the NAND gate 36. If the NAND gate 36 is enabled by the comparator 32, it sends the "on" pulse to a motor drive and switching regulator circuit 40.

The motor drive circuit 40 powers a shaker motor 42. The motor is a 1.5 volt DC motor that includes an eccentrically-mounted weight 43. The spinning weight produces a vibration that can be felt by a user holding the test instrument. Such motors are typically found in pagers. The faster the motor turns the greater is the intensity of the vibration. Thus, since the motor speed in the present invention varies with the AC input voltage level, the resulting vibration intensity can give an approximation of the AC voltage level. That is, the user will be able to feel the difference between high and low voltages. Since the motor is designed to operate at 1.5 VDC and the battery typically used in test instruments is a nominal 9 volt battery, the motor drive circuit 40 is used to efficiently drop the voltage supplied to the motor 42 without unnecessarily draining the battery. In this sense the motor drive circuit is sometimes referred to as a chopper or switching circuit. The drive circuit will apply 1.5 volts to the motor during the time or width of each "on" pulse coming from NAND gate 36. When each "on" pulse ends, the power to the motor shuts off, although the motor will not necessarily stop spinning before the next pulse begins. The average speed of the motor depends on the pulse frequency which depends on the DC control level voltage which in turn depends on the AC input voltage. Thus, the motor speed, and therefore the vibration intensity, depends on the level of the AC input voltage.

A possible alternate arrangement of the shaker circuit could be used. In this alternate embodiment the NAND gate 36 and variable duty cycle square wave generator 38 are deleted. A buffered DC control level voltage, at the output of U16A, could be applied directly to the motor drive and switching regulator. That is, the output of U16A with inversion could be connected to transistor Q11. Or perhaps more preferably the NAND gate 36 would be retained to prevent operation at low input voltages. In either case, since transistor Q11 is both state sensitive and amplitude sensitive, the motor drive and switching regulator circuit 40 can be driven either with a pulse train, as shown in FIG. 2, or with a variable DC voltage, as suggested in the alternate embodiment. In the present invention the variable duty cycle square wave generator 38 has been retained because of its versatility. That is, the shaker motor can easily be made to come to a complete rest between drive pulses, offering a different "feel" to the user, by simply making component value changes.

Turning now to FIG. 3, a clean power circuit is shown. The object of this circuit is to notify the user when total harmonic distortion and noise in a power line is at an acceptable level. The circuit takes an AC voltage signal in through the input probe either directly or via an attenuator as shown at ACI. The signal is supplied to a first converter 44 which is similar to the converter 30. In this instance, however, both a DC control level and an exact replica of the input voltage are obtained from the converter. These are shown at HCIN and HCCMP. The HCIN signal is a buffered replica of the AC input at ACI. It includes the fundamental signal plus noise plus distortion (commonly referred to as S+N+D). HCCMP is a negative-going DC equivalent of HCIN. HCCMP tracks the average amplitude of HCIN. The AC signal HCIN is supplied to a pre-amplifier 46 that amplifies the HCIN signal prior to supplying it to a band reject filter circuit 48. In the illustrated circuit the pre-amplifier gain is about 5. The band reject filter circuit 48 notches out or removes a selected single frequency signal from the HCIN to create an AC non-fundamental signal. Variable resistor VR3 can be set to remove either a 50 Hz or 60 Hz fundamental frequency from the HCIN signal. This removal leaves only an AC non-fundamental signal which consists of whatever noise and/or harmonic distortion was in the AC input signal.

The non-fundamental signal consisting of N+D is supplied to a second converter 50. The second converter includes a diode D19 that compresses the dynamic range, that is, it clamps excesses of voltages. The second converter 50 converts the AC non-fundamental signal to a DC signal which is proportional to the total distortion and noise in the AC input signal, hereinafter referred to as the distortion signal. The second converter also provides conversion gain to the distortion signal. The distortion signal becomes one input to a comparator 52. The second input to the comparator 52 comes from a comparison voltage circuit 54. Circuit 54 receives the HCCMP signal and applies a filtered comparison voltage to pin 5 of op amp U15B. The distortion signal is applied to pin 6 of U15B. The voltage divider at R142 and R144 sets the comparison threshold of U15B. Thus, the comparator 52 compares the distortion signal N+D to the DC equivalent of the full AC input, S+N+D. This means the LED circuit 56 triggers on the % THD, not on an absolute value of N+D. If the distortion signal exceeds the comparison voltage, the output of op amp U15B is at a logic high level. In that condition the LED circuit 56 will be inactive. If the distortion signal, i.e., the noise plus distortion, is lower than the reference voltage, then pin 7 of U15B goes low, thereby allowing a current to flow through LED D22. Thus, if the noise plus distortion in the AC signal is low, the LED lights and the user will know the power is "clean".

It will be realized the LED could be arranged to turn on in the presence of high noise and distortion. For example a red LED might turn on if noise and distortion are high. Another possibility would be to light a green LED with clean power and light a red LED for non-clean power.

FIG. 4 illustrates a non-contact voltage testing circuit. The circuit includes a sensor 58 that is a flat, metallic plate imbedded in the blade 28 on fixed jaw 26. The sensor 58 connects to an amplifier 60 which in turn supplies the signal to a buffer 62. The buffer normally disables oscillator 64.

The oscillator supplies a signal to an on/off controller 66. Controller 66 turns both an LED 68 and a beeper 70 on and off. When the user wants to know if a voltage is present, he or she places the blade 28 near the wire or other circuit element of concern. If an electrostatic field is present it induces a voltage in the sensor 58. That voltage is amplified at 60 and buffered at 62 to enable the oscillator 64. The on/off controller will activate the LED 68 and beeper 70.

While a preferred form of the invention has been shown and described, it will be realized that alterations and modifications may be made thereto without departing from the scope of the following claims.

What is claimed is:

1. An electronic test instrument, comprising:
   a probe for acquiring an AC voltage input signal;
   a converter circuit connected to the probe for converting the AC voltage signal to a DC control level voltage proportional to the AC voltage signal; and
   a motor having an eccentrically-mounted weight for creating vibration when the motor is activated, the motor being activated in response to the DC control level voltage so as to run at a rate proportional to the AC voltage input signal.

2. The electronic test instrument of claim 1 further comprising:
   a reference voltage;
   a comparator that provides an on signal when the DC control level voltage is greater than the reference voltage; and
   a gate circuit responsive to the on signal to permit activation of the motor.

3. The electronic test instrument of claim 1 further comprising a clamp for engaging an AC line.

4. The electronic test instrument of claim 1 further comprising a motor drive and switching regulator circuit connected between the converter circuit and the motor, the motor drive and switching regulator circuit being responsive to the DC control level voltage.

5. The electronic test instrument of claim 4 further comprising:
   a variable duty cycle square wave generator circuit connected between the converter circuit and the motor drive and switching regulator circuit, the variable duty square wave generator circuit creating a series of on-off pulses and being responsive to the DC control level voltage to make the width of at least one of the on or off pulses proportional to the DC control level voltage.

6. The electronic test instrument of claim 4 wherein the motor drive and switching regulator circuit includes a battery and a chopper circuit that efficiently decreases the voltage from the battery prior to applying it to the motor.

7. An electronic test instrument, comprising:
   a probe for acquiring an AC voltage input signal;
   a first converter circuit for converting the AC voltage input signal to a DC equivalent reference voltage signal;
   a band reject filter circuit for notching out a selected frequency signal from the AC voltage input signal to create an AC non-fundamental signal;
   a second convener circuit for converting the AC non-fundamental signal to a distortion signal which is proportional to the total distortion and noise in the AC voltage input signal;
   a comparator circuit for comparing the distortion signal to the DC equivalent reference voltage; and
   an indicator for indicating at least one of the conditions where the DC non-fundamental signal is above or below the DC equivalent reference voltage.

8. The electronic test instrument of claim 7 further comprising a pre-amplifier circuit between the probe and the band reject filter circuit.

9. The electronic test instrument of claim 7 further comprising a ripple filter for the DC equivalent reference voltage.

10. The electronic test instrument of claim 7 further comprising:
    a converter circuit connected to the probe for converting the AC voltage signal to a DC control level voltage proportional to the AC voltage signal; and
    a motor having an eccentrically-mounted weight for creating vibration when the motor is activated, the motor being activated in response to the DC control level voltage so as to run at a rate proportional to the AC voltage input signal.

11. An electronic test instrument, comprising:
    a housing having first and second jaws at one end of the housing forming a clamp, at least one of the jaws being movable into and out of engagement with the other jaw;
    a blade protruding from one of said jaws and having a sensor embedded therein;
    an electrical circuit in the housing in electrical connection with the sensor, the circuit being operable to indicate the presence of a voltage near the blade;
    a probe for acquiring an AC voltage input signal;
    a first converter circuit for converting the AC voltage input signal to a DC equivalent reference voltage signal;
    a band reject filter circuit for notching out a selected frequency signal from the AC voltage input signal to create an AC non-fundamental signal;
    a second converter circuit for converting the AC non-fundamental signal to a distortion signal which is proportional to the total distortion and noise in the AC voltage input signal;
    a comparator circuit for comparing the distortion signal to the DC equivalent reference voltage; and
    an indicator for indicating at least one of the conditions where the DC non-fundamental signal is above or below the DC equivalent reference voltage.

12. An electronic test instrument, comprising:
    a housing having first and second jaws at one end of the housing forming a clamp, at least one of the jaws being movable into and out of engagement with the other jaw;
    a blade protruding from one of said jaws and having a sensor embedded therein;
    an electrical circuit in the housing in electrical connection with the sensor, the circuit being operable to indicate the presence of a voltage near the blade;
    a probe for acquiring an AC voltage input signal;
    a converter circuit connected to the probe for converting the AC voltage signal to a DC control level voltage proportional to the AC voltage signal; and
    a motor having an eccentrically-mounted weight for creating vibration when the motor is activated, the motor being activated in response to the DC control level voltage so as to run at a rate proportional to the AC voltage input signal.

13. The electronic test instrument of claim 12 further comprising:

a first converter circuit for converting the AC voltage input signal to a DC equivalent reference voltage signal;

a band reject filter circuit for notching out a selected frequency signal from the AC voltage input signal to create an AC non-fundamental signal;

a second converter circuit for converting the AC non-fundamental signal to a distortion signal which is proportional to the total distortion and noise in the AC voltage input signal;

a comparator circuit for comparing the distortion signal to the DC equivalent reference voltage; and an indicator for indicating at least one of the conditions where the DC non-fundamental signal is above or below the DC equivalent reference voltage.

* * * * *